(12) United States Patent
Wang et al.

(10) Patent No.: US 8,508,264 B1
(45) Date of Patent: Aug. 13, 2013

(54) POWER ON RESET APPARATUS

(75) Inventors: Binan C. Wang, Tucson, AZ (US); Paul Stulik, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/361,663

(22) Filed: Jan. 30, 2012

(51) Int. Cl.
 *H03L 7/00* (2006.01)
(52) U.S. Cl.
 USPC ............................. 327/143; 327/142; 327/198
(58) Field of Classification Search
 USPC .......................................... 327/142, 143, 198
 See application file for complete search history.

(56) References Cited

U.S. PATENT DOCUMENTS

2003/0189450 A1* 10/2003 Kamata .......................... 327/143

* cited by examiner

*Primary Examiner* — John Poos
(74) *Attorney, Agent, or Firm* — John R. Pressetto; W. James Brady; Frederick J. Telecky, Jr.

(57) ABSTRACT

A power on reset (POR) circuit is provided. For the POR circuit, a PMOS transistor is coupled to a first voltage rail at its source. A drive circuit is coupled to the drain of the PMOS transistor and is configured to output a POR signal. A voltage divider is coupled between the drain of the PMOS transistor and the second voltage rail. A switch network is provided as well, which has first and second switches. The first switch is coupled between the gate of the PMOS transistor and the voltage divider, and the second switch is coupled between the gate of the PMOS transistor and the voltage divider. A controller is also coupled to control the first and second switches, wherein the first and second switches are complementary driven.

5 Claims, 4 Drawing Sheets

POWER ON RESET APPARATUS

TECHNICAL FIELD

The invention relates generally to a power on reset (POR) circuit.

BACKGROUND

Turning to FIGS. 1 and 2, an example of a conventional POR circuit 100 and its desired performance can be seen. Typically, the POR circuit 100 is intended to provide a reset or reset signal during times of applied ramp up of the voltage on rail VDD. This can allow logic and other circuitry within a system in which the POR circuit 100 is employed to be reset to a default state during ramp up of the voltage on rail VDD or to restore the default state during a "brownout" event. To do this, the POR circuit 100 has two characteristic voltages: high threshold PORH and a low threshold PORL. The high threshold PORH is the "release threshold," where the POR circuit 100 releases the reset signal as the voltage on rail VDD is increasing or ramping up to the nominal voltage VDDN, and the low threshold PORL is the "activate threshold," where the reset signal is asserted as the voltage on rail VDD is decreasing or ramping down. The low threshold PORL is a lower voltage than high threshold PORH so as to provide a hysteresis to prevent "bouncing" of the reset signal POROUT if the voltage on rail VDD is near the threshold.

When the voltage on voltage rail VDD is rising or ramping up (i.e., between times T1 and T2 and between times T7 and T8), the POR signal POROUT (which is an active low reset signal) transitions from logic low (or "0") to logic high (or "1") once the voltage on rail VDD becomes greater than high threshold PORH (and which eventually reaches a nominal voltage VDDN). Typically, this ramping up or increase in the voltage occurs during power-up (i.e., between times T1 to T2) or following a "brownout" event (i.e., between times T12 and T13). In the structure shown in FIG. 1, this high threshold PORH is set by the characteristics of transistors Q1 and Q4 and resistor R1. Looking first to transistor Q1 (which, as shown is a PMOS transistor), the drain current $I_D$, in saturation, for transistor Q1 is:

$$I_D = \frac{1}{2}\left(\frac{W}{L} \cdot \mu C_{OX}\right)(V_{GS} - V_{TP})^2 = \frac{k}{2}(V_{GS} - V_{TP})^2, \quad (1)$$

where $V_{GS}$ is the gate-source voltage of transistor Q1, $V_{TP}$ is the threshold voltage for transistor Q1, W/L is the aspect ratio (channel width to length) of transistor Q1, $\mu$ is the charge-carrier mobility, and $C_{OX}$ is the gate oxide unit capacitance. So, as a result of configuration of POR circuit 100, the POR circuit 100 is released when:

$$R1 \cdot I_D \geq V_{TN}, \quad (2)$$

where $V_{TN}$ is the threshold voltage of transistor Q4 (which, as shown, is an NMOS transistor). Substituting equation (1) into equation (2) and solving for the gate-source voltage $V_{GS}$ of transistor Q1 (which is the high threshold PORH), the high threshold PORH is:

$$V_{GS} = PORH = V_{TP} + \sqrt{\frac{2V_{TN}}{R1 \cdot K}}. \quad (3)$$

From equation (3), it can be seen that the high threshold PORH is a function of the relationship between resistor R1 and transistor Q1, namely the relative strength between resistor R1 and transistor Q1. By relative strength, this refers to how "strong" or "weak" the transistor Q1 and resistor R1 are with respect to one another. For example, if resistor R1 is large (i.e., up to 10's of MΩ), transistor Q1 would be a correspondingly "weak" transistor (i.e., having a low aspect ratio relative to resistor R1) to achieve the desired high threshold PORH. As an example, if the resistor R1 is on the order of 10's of MΩ, then the aspect ratio for transistor Q1 would be in the neighborhood of 1/10 for a 0.5 μm process node. A "strong" transistor for this example might have an aspect ratio of 10/1. Typically, R1 is on the order of 10's of MΩ to reduce power consumption, causing transistor Q1 to have a low aspect ratio (i.e., about 1/10) in order to achieve the desired high threshold PORH. Also, transistor Q4 of inverter 102 is usually set to be a "strong" transistor, while transistor Q3 of inverter 102 is set to be a "weak" transistor (i.e., having a low aspect ratio relative to transistor Q4). Because the resistance of resistor R1 can vary with process and temperature and because transistor Q1 is usually a "weak" transistor (which is highly susceptible to process and temperature variation independent of the variations in resistor R1), the relative strength (and, thus, the threshold PORH) can vary substantially due to process variations. This means that, for the POR circuit 100, the high threshold PORH is poorly controlled.

Once the voltage on rail VDD is greater than the high threshold PORH, transistor Q2 is able to turn "on," providing a hysteresis. The POR circuit 100 can then reassert the POR signal POROUT as the voltage on rail VDD begins to fall or ramp down during, for example, power down or a "brownout" event (i.e., at times T4 and T10). The low threshold PORL is typically set by the characteristics of transistor Q2. Typically, transistor Q2 is a "strong" transistor (i.e., having a high aspect ratio relative to resistor R1). For example, transistor Q2 may have an aspect ratio of 10/1 for 0.5 μm process node when resistor R1 is on the order of 10's of MΩ. As a result, the low threshold PORL is approximately equal to the threshold voltage $V_{TP}$ of transistor Q2. Additionally, there can be a threshold voltage mismatch between transistors Q1 and Q2 that can create an extra variation in the hysteresis voltage (which is generally the difference between the high threshold PORH and the low threshold PORL). As a result, the "brownout" performance may suffer due to the poor control of the hysteresis voltage.

Thus, there is a need for an improved POR circuit.

SUMMARY

An embodiment of the present invention, accordingly, provides an apparatus. The apparatus comprises a first voltage rail; a second voltage rail; a PMOS transistor that is coupled to the first voltage rail at its source; a drive circuit that is coupled to the drain of the PMOS transistor and that is configured to output a power on reset (POR) signal; a voltage divider that is coupled between the drain of the PMOS transistor and the second voltage rail; a switch network having: a first switch that is coupled between the gate of the PMOS transistor and the voltage divider; and a second switch that is coupled between the gate of the PMOS transistor and the voltage divider; and a controller that is coupled to control the first and second switches, wherein the first and second switches are complementary driven.

In accordance with an embodiment of the present invention, the drive circuit further comprises an inverter string.

In accordance with an embodiment of the present invention, the voltage divider further comprises a plurality of impedance elements coupled in series with one another between the drain of the PMOS transistor and the second voltage rail, and wherein the first switch is coupled to a first node within the voltage divider, and wherein the second switch is coupled to a second node within the voltage divider.

In accordance with an embodiment of the present invention, the plurality of impedance elements further comprises a plurality of resistors.

In accordance with an embodiment of the present invention, wherein the first switch further comprises a first NMOS transistor that is coupled to the first node of the voltage divider at its source and the gate of the first PMOS transistor at its drain, and wherein the second switch further comprises a second NMOS transistor that is coupled to the second node of the voltage divider at its source and the gate of the first PMOS transistor at its drain.

In accordance with an embodiment of the present invention, the controller further comprises: an output node of the inverter string that is coupled to apply the POR signal to the gate of the second NMOS transistor; and an internal node of the inverter string that is coupled to apply an inverse of the POR signal to the gate of the first NMOS transistor.

In accordance with an embodiment of the present invention, the controller further comprises a break-before-make circuit.

In accordance with an embodiment of the present invention, the controller further comprises: an output node of the inverter string that is coupled to apply the POR signal to the gate of the second NMOS transistor; and an inverter that is coupled to the output node and the gate of the first NMOS transistor.

In accordance with an embodiment of the present invention, the second node of the voltage divider is coupled to the second voltage rail.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
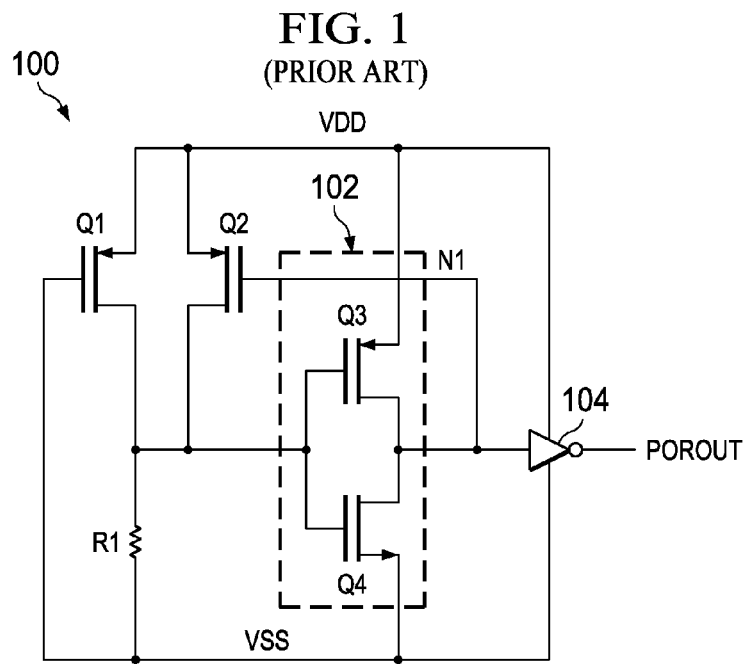
FIG. 1 is a diagram of an example of a conventional POR circuit.

Refer now to the drawings wherein depicted elements are, for the sake of clarity, not necessarily shown to scale and wherein like or similar elements are designated by the same reference numeral through the several views.

Figure 3:
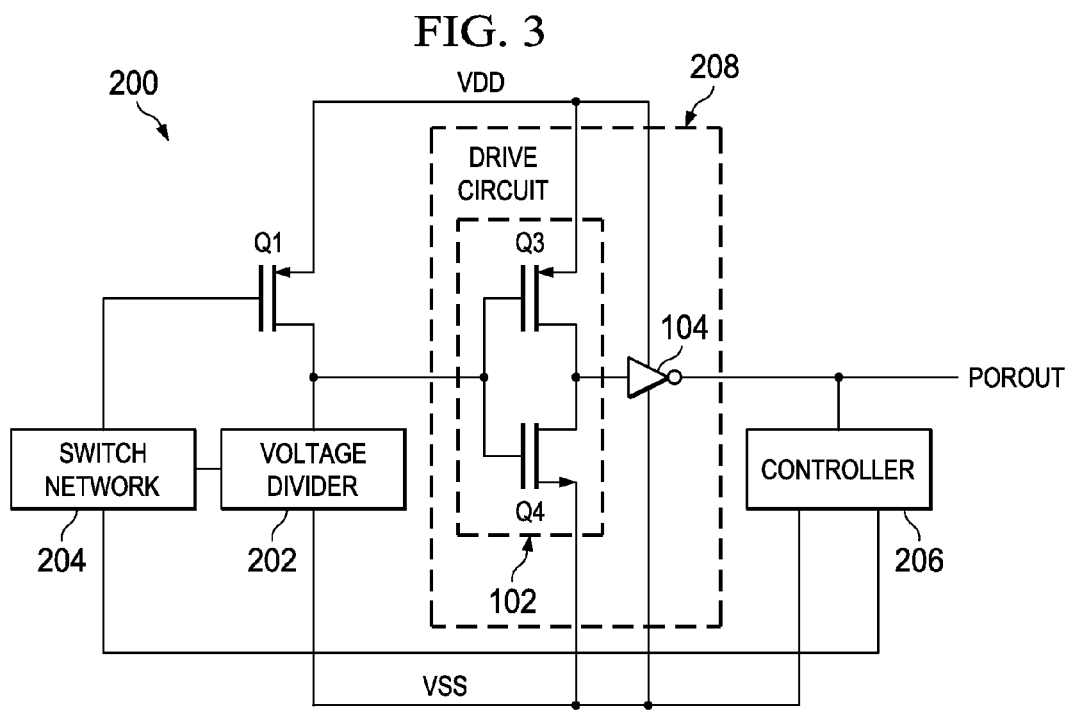
FIGS. 3-5 are diagrams of examples of a POR circuit in accordance with the present invention.

Turning to FIG. 3, an example of a POR circuit 200 can be seen. In this example, high and low threshold voltages PORH and PORL are set by the characteristics of switch network 204, the threshold voltage $V_{TP}$ of transistor Q1, the threshold voltage $V_{TN}$ of transistor Q4, and voltage divider 202. The drain of transistor Q1 is then able to provide a signal to the drive circuit 208 so as to generate the POR signal POROUT. In this example, an inverter string using inverters 102 and 104 is employed, but other configurations may be used as well (which can, for example, have fewer or more inverters or may employ one or more Schmitt triggers). A controller 206 then generates the controls signal(s) for the switch network 204 based at least in part on the POR signal POROUT.

Figure 4:
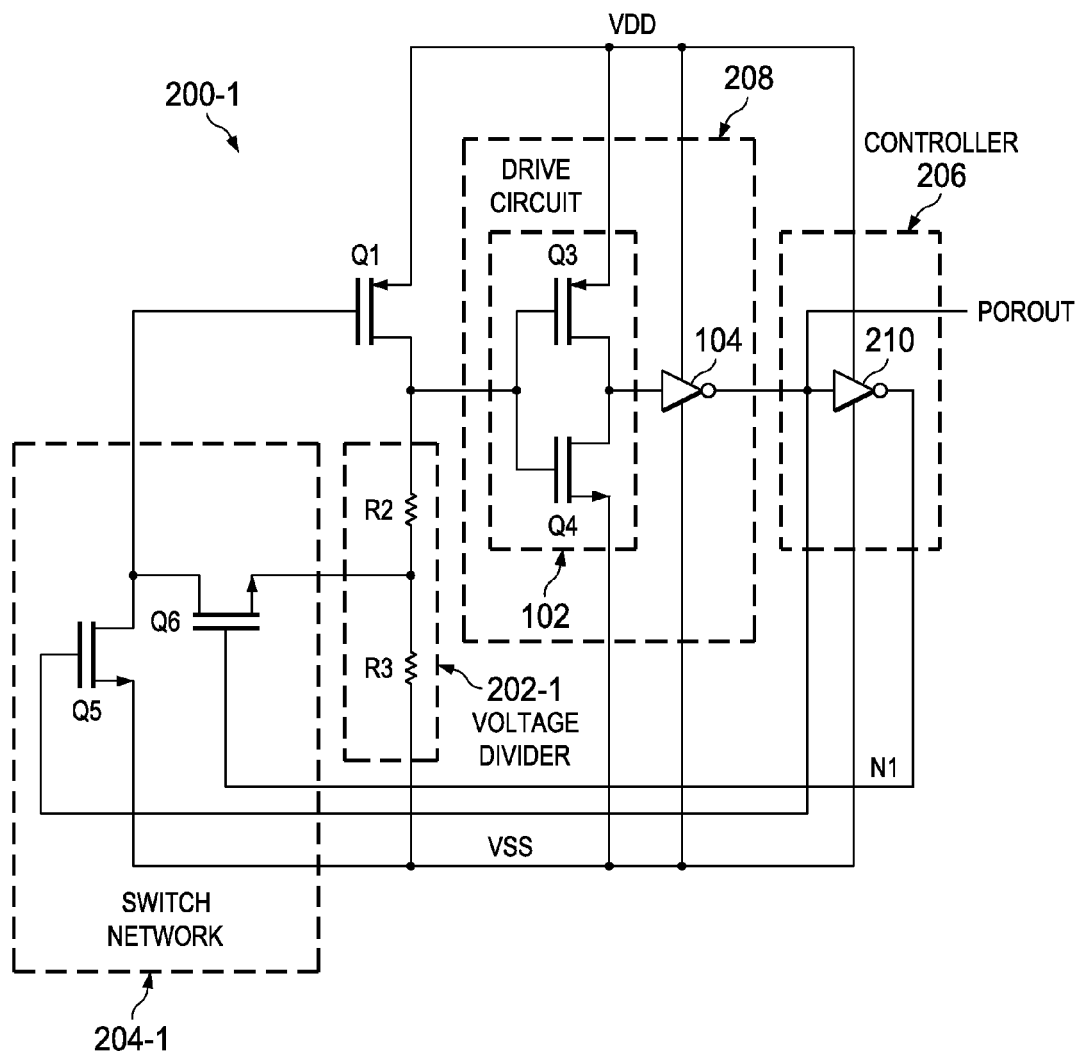

In FIG. 4, a more detailed example of the POR circuit 200 (which is labeled 200-1) can be seen. In this example, the voltage divider 202-1 is generally comprised of resistors R2 and R3 (other types of impedance elements, such as transistors operated in their linear region, can, however, be employed) coupled in series with one another between the drain of transistor Q1 and rail VSS. The switch network 204-1 in this example is generally comprised of NMOS transistors Q5 and Q6 (which operate as switches) that are coupled to the gate of transistor Q1 and to nodes within voltage divider 202-1 (which as shown in this example are the node between resistors R2 and R3 and the node coupled to rail VSS). These switches or transistors Q5 and Q6, in this example, are also controlled by the inverter 210 (namely the input and output terminals or nodes of inverter 210).

Figure 2:
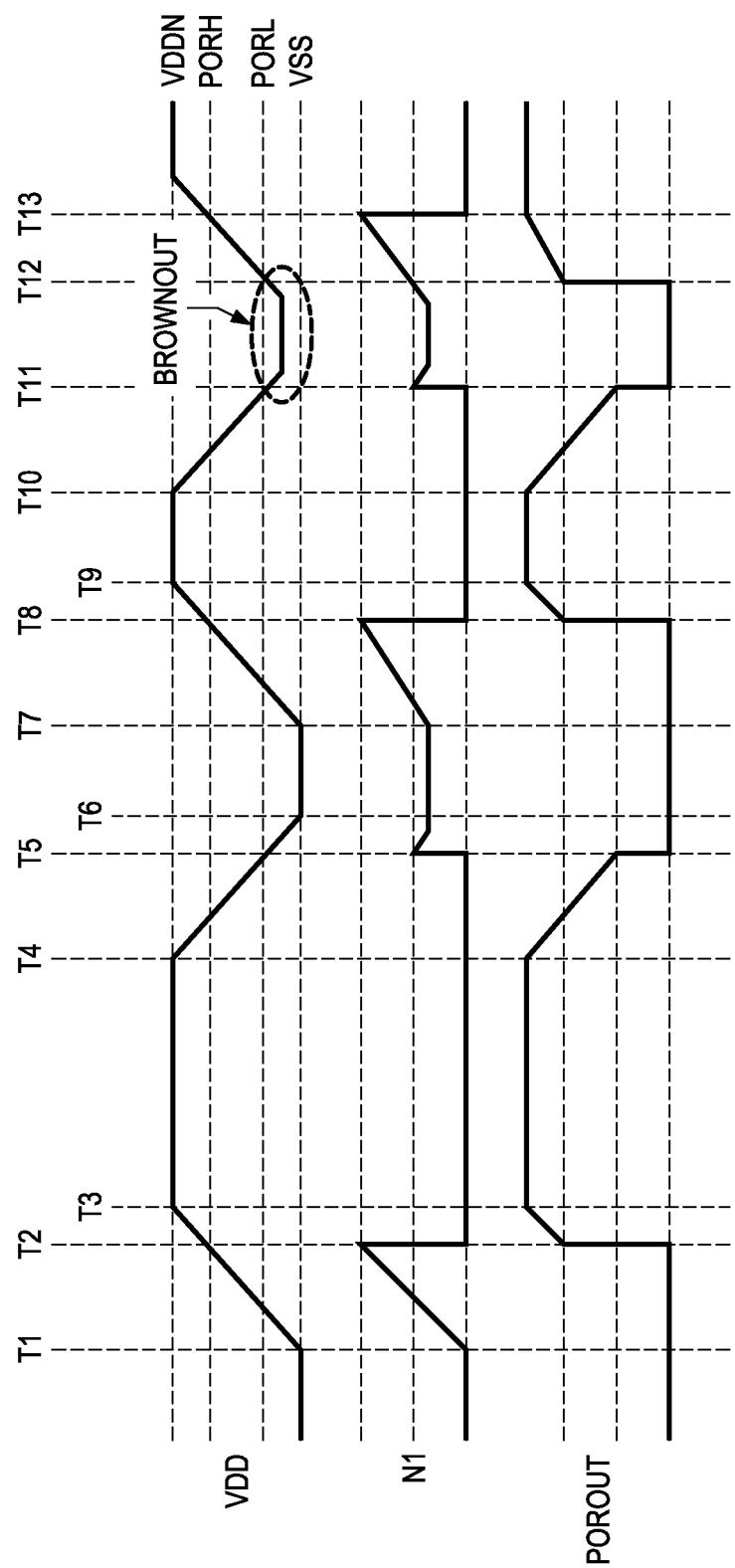
FIG. 2 is a diagram illustrating the desired performance of the POR circuit of FIGS. 1 and 3-5.

With POR circuit 200-1 and as the voltage on rail VDD is ramping up or rising (i.e., between times T1 and T2 of FIG. 2) during, for example, power up or following a "brownout" event (i.e., between times T12 and T13 of FIG. 2), the POR signal POROUT (which, again, is an active low signal) is initially logic low, meaning that transistor Q5 is "off" and that transistor Q6 is "on,", coupling the gate of transistor Q1 to the node between resistors R2 and R3. For the example shown in FIG. 4, transistor Q1 is deliberately chosen to be a "strong" transistor (i.e., high aspect ratio relative to divider 202-1) to reduce the effects of process variation on the high threshold PORH. Once the voltage on rail VDD has ramped up to the high threshold PORH, the POR signal POROUT transitions from logic low to logic high. In contrast to the POR circuit 100 (where the threshold PORH is set by characteristics of transistors Q1 and Q4 and resistor R1), this high threshold PORH is set by the characteristics of transistors Q1 and Q4 and the voltage divider 202-1. Looking first to transistor Q1, the POR circuit 200-1 is released when:

$$V_D \geq V_{TN}, \qquad (4)$$

where $V_D$ is the drain voltage of transistor Q1, where $V_{TN}$ is the threshold voltage of transistor Q4, and where it is assumed that transistor Q4 is "stronger" than transistor Q3. For equation (4), this means that the gate voltage $V_G$ of transistor Q1 is:

$$V_G = V_{TN} \frac{R3}{R2 + R3}. \qquad (5)$$

Since the transistor Q1 is "strong" relative to the resistors R2 and R3, the gate-source voltage $V_{GS}$ to turn on transistor Q1 is approximately equal to the threshold voltage $V_{TP}$ of transistor Q1, so the high threshold PORH is:

$$PORH = V_{TP} + V_{TN} \frac{R3}{R2 + R3}. \quad (6)$$

Thus, the high threshold PORH is now set by the threshold voltage of Q1/Q4 and the resistor ratio, making it less susceptible to process variation compared to the POR circuit 100.

As stated above, once the voltage on rail VDD reaches high threshold PORH (i.e., between times T2 and T4), the POR circuit 200-1 is released. When the POR circuit 200-1 is released, transistor Q6 is switched "off," and transistor Q5 is switched "on," coupling the gate of transistor Q1 to rail VSS. By coupling the gate of transistor Q1 to rail VSS (which is usually coupled to ground), the low threshold PORL is the threshold voltage $V_{TP}$ of transistor Q1. So, as the voltage on rail VDD decreases or ramps down (i.e., between times T4 to T5 and T10 to T11 in FIG. 2) during, for example, power down or a "brownout" event, the POR circuit 200-1 is reasserted when the low threshold PORL is reached. Because transistor Q2 is omitted, the threshold voltage mismatch can be eliminated, better controlling the hysteresis voltage.

Figure 5:
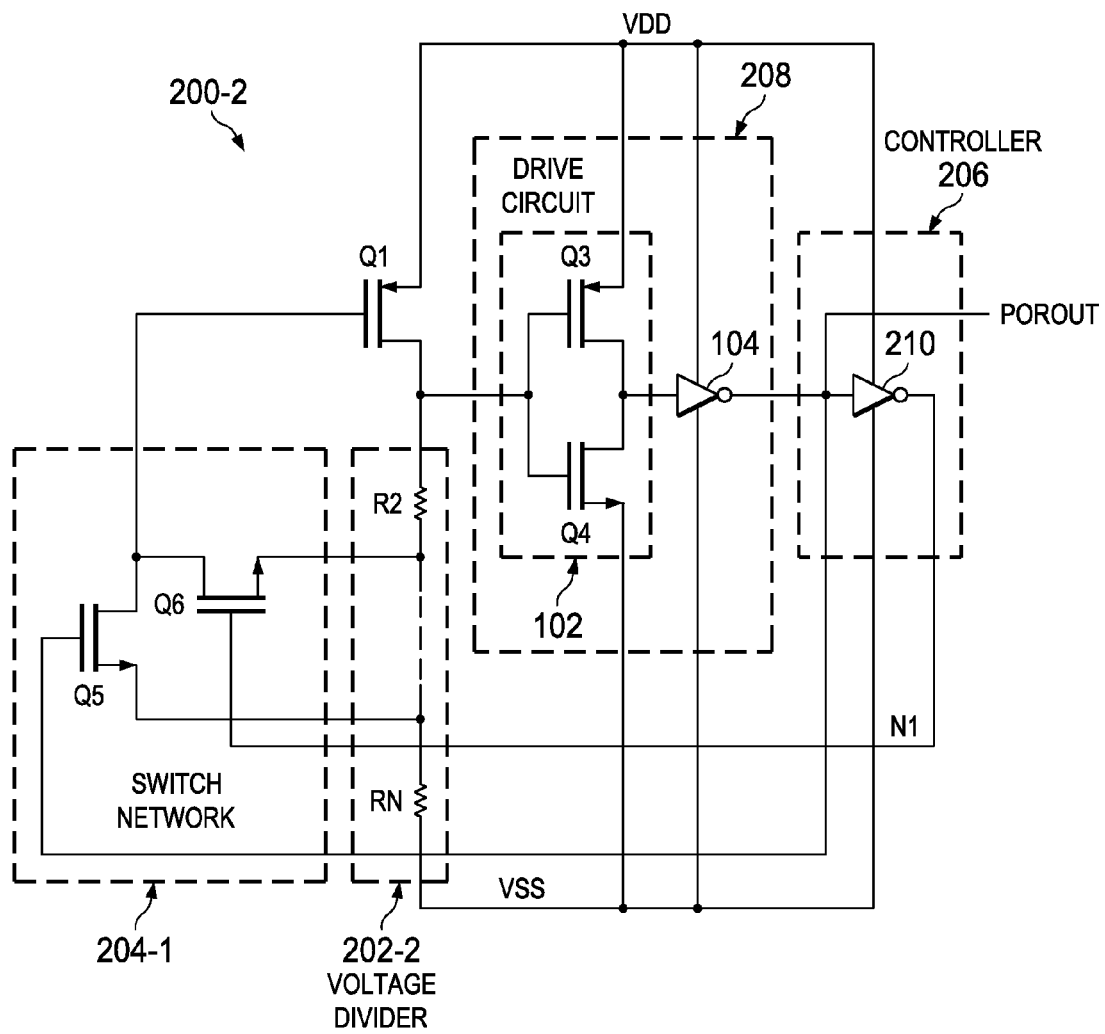

Alternatively, the POR circuit 200-2 (as shown in FIG. 5), the low threshold PORL can be adjusted to a higher level. To accomplish this, voltage divider 202-2 is employed. As shown, there are multiple resistors R2 to RN that are coupled in series with one another. The switches Q5 and Q6 can then be coupled to various nodes within the voltage divider 202-2 to achieve the desired thresholds. To preserve functionality of the POR circuit 200-2, however, the voltage applied to the source of transistor Q6 should be larger than the voltage applied to the source of transistor Q5.

The controller, too, may have multiple configurations. Controller 206 may also be configured to be nodes within drive circuit 208 (such as the output node of drive circuit 208 and the node between inverters 102 and 104). Other configuration may also be employed where transistors Q5 and Q6 are driven by non-overlapping signals (such as a break-before-make logic circuit which can provide complementary signal).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a first voltage rail;
a second voltage rail;
a PMOS transistor that is coupled to the first voltage rail at its source;
an inverter string that is coupled to the drain of the PMOS transistor and that is configured to output a power on reset (POR) signal;
a voltage divider that is coupled between the drain of the PMOS transistor and the second voltage rail;
a switch network having:
  a first switch that is coupled between the gate of the PMOS transistor and the voltage divider; and
  a second switch that is coupled between the gate of the PMOS transistor and the voltage divider; and
a controller that is coupled to control the first and second switches, wherein the first and second switches are complementary driven;
wherein the voltage divider further comprises a plurality of impedance elements coupled in series with one another between the drain of the PMOS transistor and the second voltage rail, and wherein the first switch is coupled to a first node within the voltage divider, and wherein the second switch is coupled to a second node within the voltage divider;
wherein the plurality of impedance elements further comprises a plurality of resistors;
wherein the first switch further comprises a first NMOS transistor that is coupled to the first node of the voltage divider at its source and the gate of the first PMOS transistor at its drain, and wherein the second switch further comprises a second NMOS transistor that is coupled to the second node of the voltage divider at its source and the gate of the first PMOS transistor at its drain.

2. The apparatus of claim 1, wherein the controller further comprises:
an output node of the inverter string that is coupled to apply the POR signal to the gate of the second NMOS transistor; and
an internal node of the inverter string that is coupled to apply an inverse of the POR signal to the gate of the first NMOS transistor.

3. The apparatus of claim 1, wherein the controller further comprises a break-before-make circuit.

4. The apparatus of claim 1, wherein the controller further comprises:
an output node of the inverter string that is coupled to apply the POR signal to the gate of the second NMOS transistor; and
an inverter that is coupled to the output node and the gate of the first NMOS transistor.

5. The apparatus of claim 4, wherein the second node of the voltage divider is coupled to the second voltage rail.

* * * * *